(12) United States Patent
Chiu et al.

(10) Patent No.: US 6,930,372 B2
(45) Date of Patent: Aug. 16, 2005

(54) STORAGE CAPACITOR OF PLANAR DISPLAY AND FABRICATION METHOD OF SAME

(75) Inventors: Chaung-Ming Chiu, Taoyuan (TW); Ya-Hsiang Tai, Hsinchu (TW)

(73) Assignee: Toppoly Optoelectronics Corp. (TW)

( * ) Notice: Subject to any disclaimer, the term of this patent is extended or adjusted under 35 U.S.C. 154(b) by 0 days.

(21) Appl. No.: 10/652,055

(22) Filed: Aug. 29, 2003

(65) Prior Publication Data
US 2004/0041187 A1 Mar. 4, 2004

(30) Foreign Application Priority Data
Aug. 30, 2002 (TW) .................................... 91119846 A

(51) Int. Cl.[7] .......................................... H01L 27/108
(52) U.S. Cl. .................. 257/532; 257/68; 257/306; 257/307; 257/308; 257/534; 438/386; 438/387; 438/396; 349/38; 349/39
(58) Field of Search .......................... 257/68, 306–309, 257/532, 534; 438/244, 253, 387, 396, 399; 349/38–39

(56) References Cited

U.S. PATENT DOCUMENTS

| | | |
|---|---|---|
| 5,350,707 A | 9/1994 | Ko et al. |
| 6,063,661 A | 5/2000 | Cheng et al. |
| 6,411,347 B1 * | 6/2002 | Park et al. ............... 349/39 |

* cited by examiner

Primary Examiner—Donghee Kang
(74) Attorney, Agent, or Firm—Madson & Metcalf

(57) ABSTRACT

A storage capacitor structure of a planar display is disclosed. The storage capacitor includes a substrate, a bottom electrode, an insulator, and a top electrode. The bottom electrode or top electrode has an uneven surface toward the insulator interposed between the two electrodes in order to increase the capacitance of the storage capacitor structure. A method for fabricating such storage capacitor structure is also disclosed. It includes steps of providing a substrate; and forming a bottom electrode, an insulator, and a top electrode in sequence. The bottom electrode or the top electrode has the uneven surface by an etching step.

16 Claims, 10 Drawing Sheets

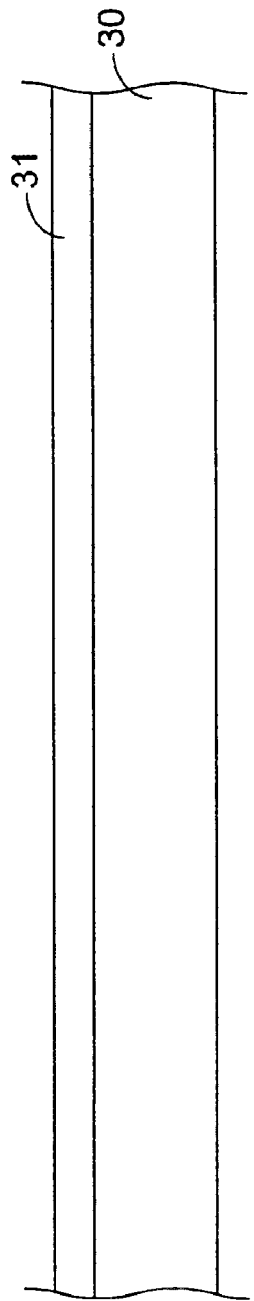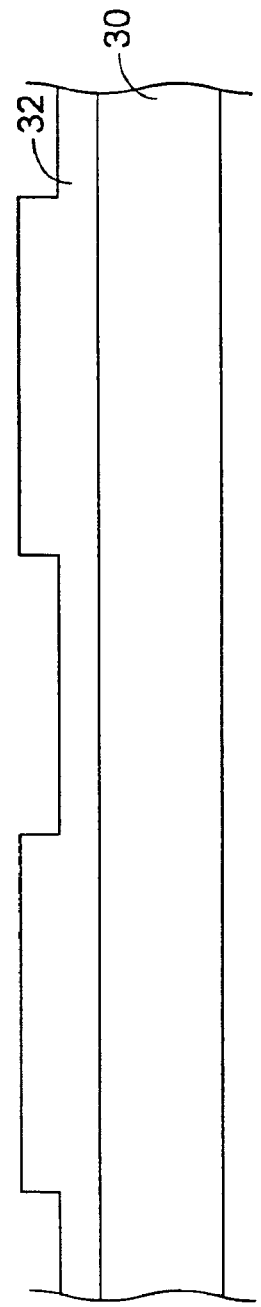
Fig.2(a)
Fig.2(b)

STORAGE CAPACITOR OF PLANAR DISPLAY AND FABRICATION METHOD OF SAME

FIELD OF THE INVENTION

The present invention relates to a storage capacitor of a planar display and its fabrication method, and more particularly to a storage capacitor structure applied to an active matrix of a planar display and its fabrication method.

BACKGROUND OF THE INVENTION

Nowadays, LCD has been applied to many fields of applications such as cellular phones, digital still cameras (DSCs), digital video cams (DVCs), camcorders, global positioning systems (GPSs), personal digital assistances (PDAs), personal computers (PCs), notebooks, and televisions (TVs). LCD has been playing an important role and helps developing trends in the future with far more characteristics and advantages like thinness, low energy consumption, high resolution, no radiation, etc. Among many kinds of LCDs, TFT-LCD is so far the most popular planar display. Please refer to FIG. 1(a) which is a circuit diagram showing one of the pixel cells of a thin film transistor liquid crystal display. The state (ON or OFF) of the thin film transistor 11 is controlled by the scan-line voltage Vs. The data-line voltage Vd is applied to the liquid crystal layer 12 interposed between the pixel electrode 131 and the common electrode 132 when the thin film transistor 11 is in an ON state. The liquid crystal molecules in the liquid crystal layer 12 will align in predetermined directions according to the applied electric field, thereby adjusting the transmittance of the crystal liquid layer 12. The amount of light emitted from the light source 14 and passing through the liquid crystal layer 12 to reach the observer's eyes is controlled in this way to achieve the display effect.

The storage capacitor 15 is employed to enhance the electric characteristics of the liquid crystal display unit by compensating the charge storage capacity of the liquid crystal display unit. Otherwise, the voltage of the liquid crystal display unit will drop stage by stage due to current leakage after turning off the thin film transistor 11. It is known that the capacitance of the storage capacitor 15 will affect the display quality. For example, undesired flicker or cross-talk results from insufficient capacitance of the storage capacitor 15. The capacitance of the storage capacitor 15 is an essential consideration for designing the liquid crystal display unit.

Please refer to FIG. 1(b) which is a schematic diagram showing the structure of the conventional thin film transistor liquid crystal display. The thin film transistor structure 21 and the storage capacitor structure 22 are formed on the substrate 20. The storage capacitor structure 22 mainly consists of a bottom electrode 221, an insulator 222, and a top electrode 223. The bottom electrode 221 and the top electrode 223 are respectively made of polysilicon and metal in the low temperature polysilicon thin film transistor (LTPS-TFT) process. The most popular method for increasing the capacitance of the storage capacitor structure 22 is to enlarge the area of the electrodes 221 and 223. Increasing the length A, however, will decrease the size of the transparent area 23. Hence, the brightness of the display is adversely affected. For overcoming such problem due to increased size of the electrodes 221 and 223, a high-power light source 14 is needed. Without doubt, it wastes energy and does not conform to the economic interests. A better method and structure are desirable according to the present invention.

SUMMARY OF THE INVENTION

An object of the present invention is to provide a storage capacitor structure having improved capacitance without increasing its size.

Another object of the present invention is to provide a method for fabricating a storage capacitor structure having improved capacitance without increasing its size.

According to a first aspect of the present invention, a storage capacitor structure of a planar display includes a bottom electrode; an insulator formed on the bottom electrode; and a top electrode formed on the insulator, wherein at least one of the bottom electrode and the top electrode has a bump structure on a surface thereof in contact with the insulator. By this way, an electrode area of the present storage capacitor can be larger than an electrode area of the conventional storage capacitor having a smooth electrode surface.

For example, the bottom electrode is made of polysilicon, the top electrode is made of metal, and the insulator is made of silicon dioxide.

In one embodiment, the bump structure includes at least one rectangular raised portion on the surface.

In one embodiment, the bump structure includes at least one rectangular recessed portion on the surface.

In one embodiment, the bump structure includes at least two strip-shaped raised portions interconnected to each other on the surface.

In one embodiment, the bump structure includes a plurality of strip-shaped raised portions arranged as a comb-like shape.

In one embodiment, the bump structure includes at least two strip-shaped recessed portions interconnected to each other on the surface.

In one embodiment, the bump structure includes a plurality of strip-shaped recessed portions arranged as a comb-like shape.

The storage capacitor structure of the present invention is preferably formed on a light-transmissible substrate.

A second aspect of the present invention relates to a method for fabricating a storage capacitor structure. The method comprising steps of providing a light-transmissible substrate; forming a bottom electrode layer having a bump structure on the substrate; forming an insulator layer on the bottom electrode layer; and forming a top electrode layer on the insulator layer.

In one embodiment, the bump structure can be created by performing a masking and etching process on the bottom electrode layer.

In accordance with a third aspect of the present invention, a method for fabricating a storage capacitor structure comprises steps of providing a light-transmissible substrate; forming a bottom electrode layer on the substrate; forming an insulator layer having a first bump structure on the bottom electrode layer; and forming a top electrode layer on the insulator layer, thereby providing the top electrode layer with a second bump structure in conforming to the first bump structure.

In one embodiment, the first bump structure can be created by performing a masking and etching process of the insulator layer.

BRIEF DESCRIPTION OF THE DRAWINGS

The present invention may best be understood through the following description with reference to the accompanying drawings, in which:

FIGS. 2(a)~(c) are schematic diagrams showing the steps for fabricating a storage capacitor structure according to a preferred embodiment of the present invention;

DETAILED DESCRIPTION OF THE INVENTION

The capacitance of a parallel-plate capacitor is proportional to the surface area of its electrodes, as shown below:

$$C = \in \times A/d$$

wherein C is capacitance; ∈ is dielectric coefficient of the insulator; A is surface area of the electrode; and d is clearance between the electrodes. Therefore, the purpose of the present invention is to increase the capacitance of the storage capacitor by means of increasing the effective surface area of the electrodes, but not the size of the electrodes.

Figure 1A:
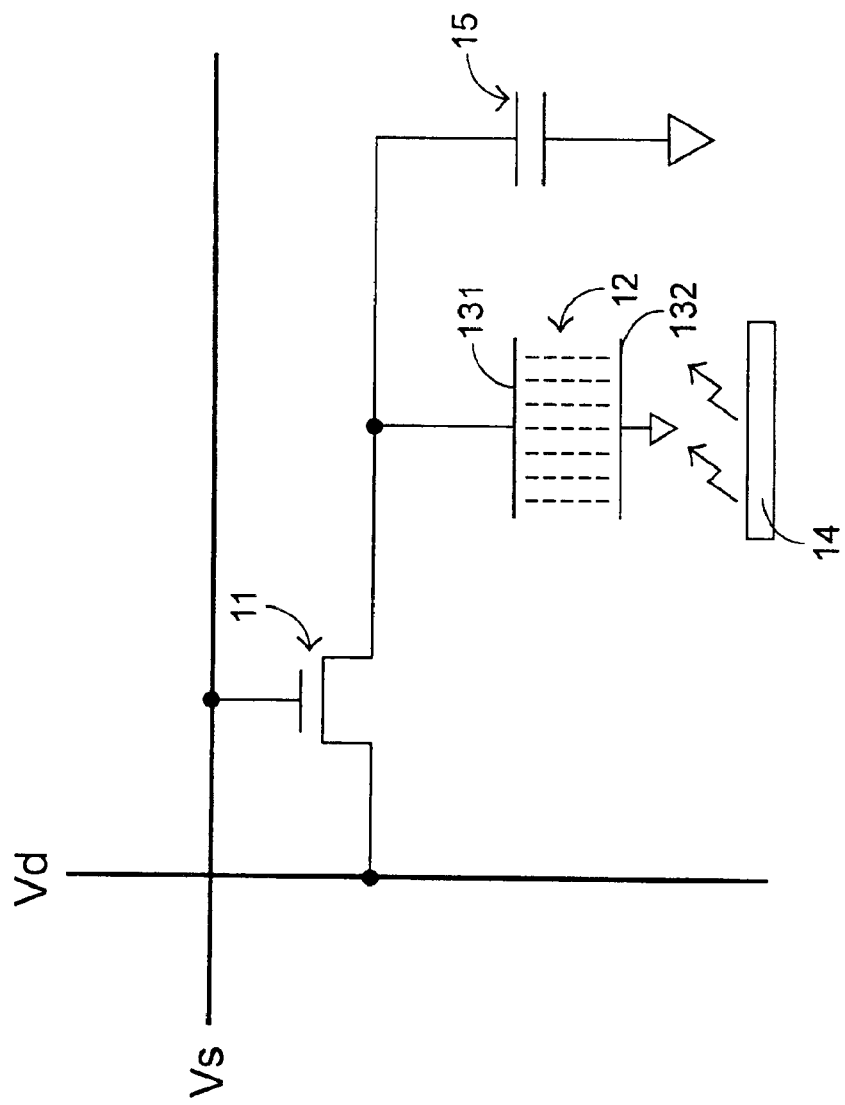
FIG. 1(a) is a circuit diagram showing one unit of a thin film transistor liquid crystal display.
Figure 1B:
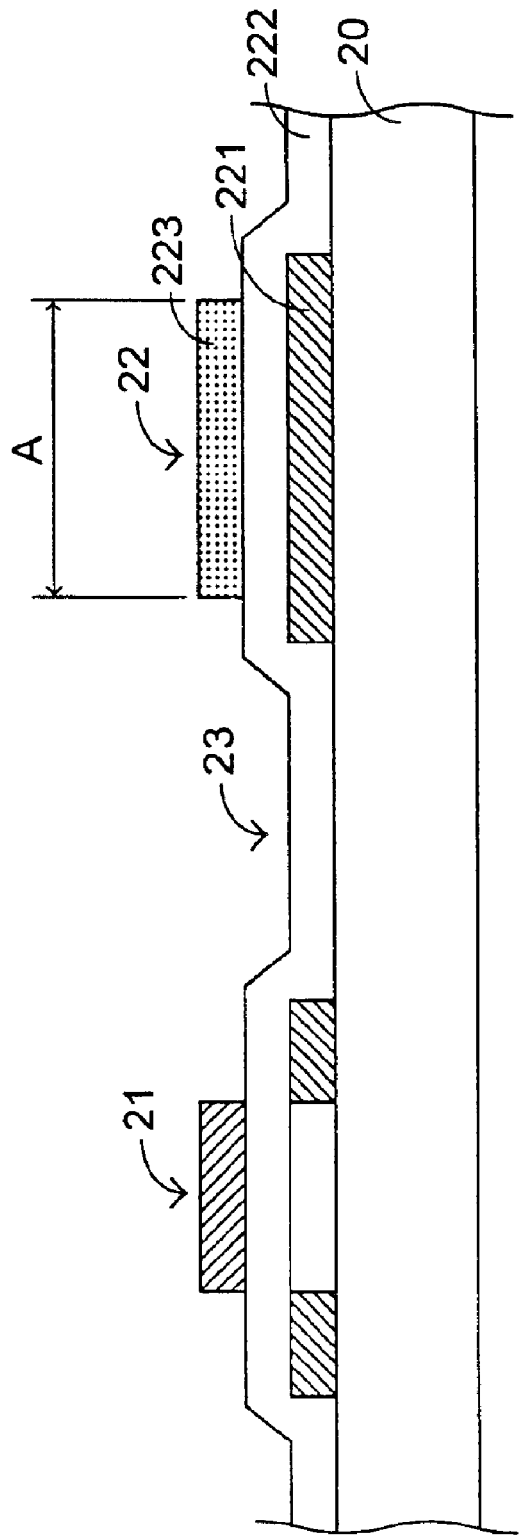
FIG. 1(b) is a schematic diagram showing the structure of the conventional thin film transistor liquid crystal display.
Figure 2C:
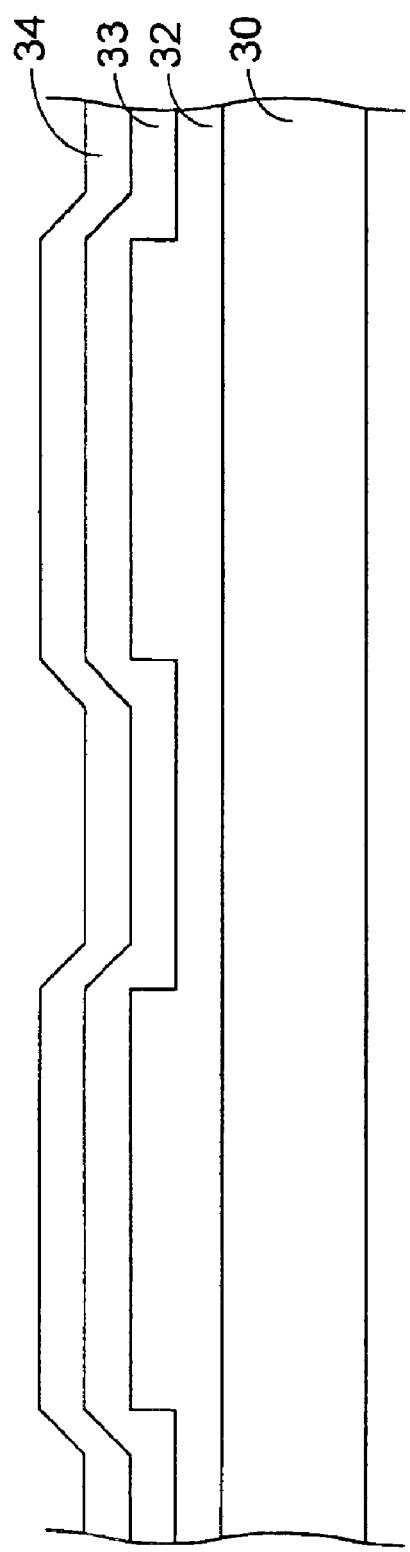

Please refer to FIG. 2 showing the steps for fabricating a storage capacitor structure according to a preferred embodiment of the present invention. At first, a raw bottom electrode layer 31, made of polysilicon, is formed on a transparent substrate 30 such as a glass substrate (FIG. 2(a)). Plasma enhanced chemical vapor deposition (PECVD) is one of the common methods for forming this polysilicon layer. Then, the raw bottom electrode layer 31 is etched by a photolithography process to form a bottom electrode 32 having an uneven bump surface (FIG. 2(b)). The bump surface consists of relatively raised portions and relatively recessed portions. Thus, the bottom electrode 32 has increased effective surface area. Accordingly, the resulting storage capacitor structure will have enhanced capacitance. Nevertheless, the transparent area outside the storage capacitor structure is not reduced, and no additional power is needed for keeping the brightness of the present liquid crystal display. The next step is forming conformal layers (insulator 33 and top electrode 34) covering the bottom electrode 32 (FIG. 2(c)). The insulator 33 is made of dielectric material such as silicon dioxide by a plasma enhanced chemical vapor deposition process, and the top electrode 34 is made of metal such as chromium, tantalum, aluminum, or copper by a sputtering process.

Figure 3A:
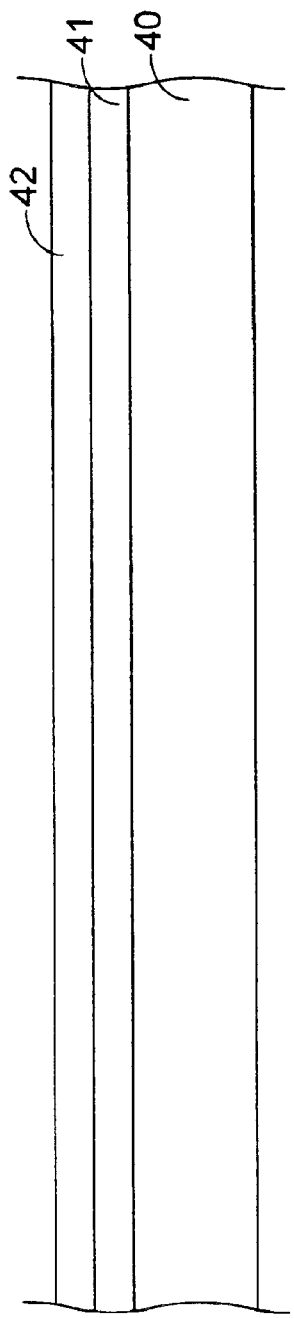
FIGS. 3(a)~(c) are schematic diagrams showing the steps for fabricating a storage capacitor structure according to another preferred embodiment of the present invention.
Figure 3B:
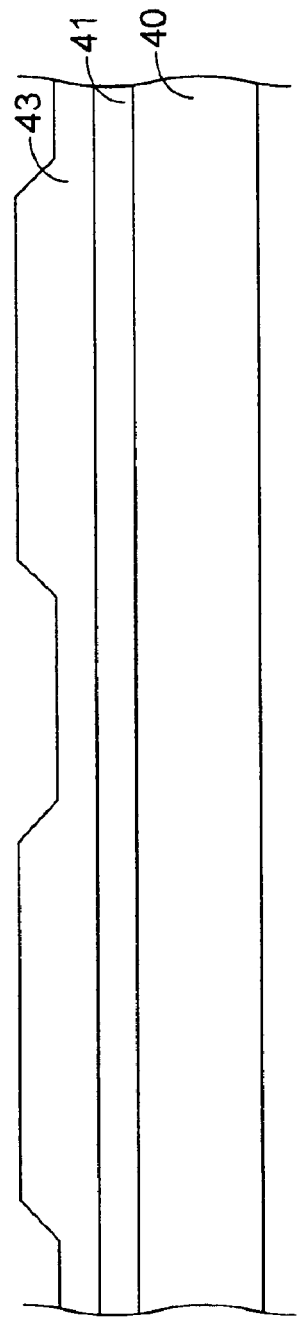
Figure 3C:
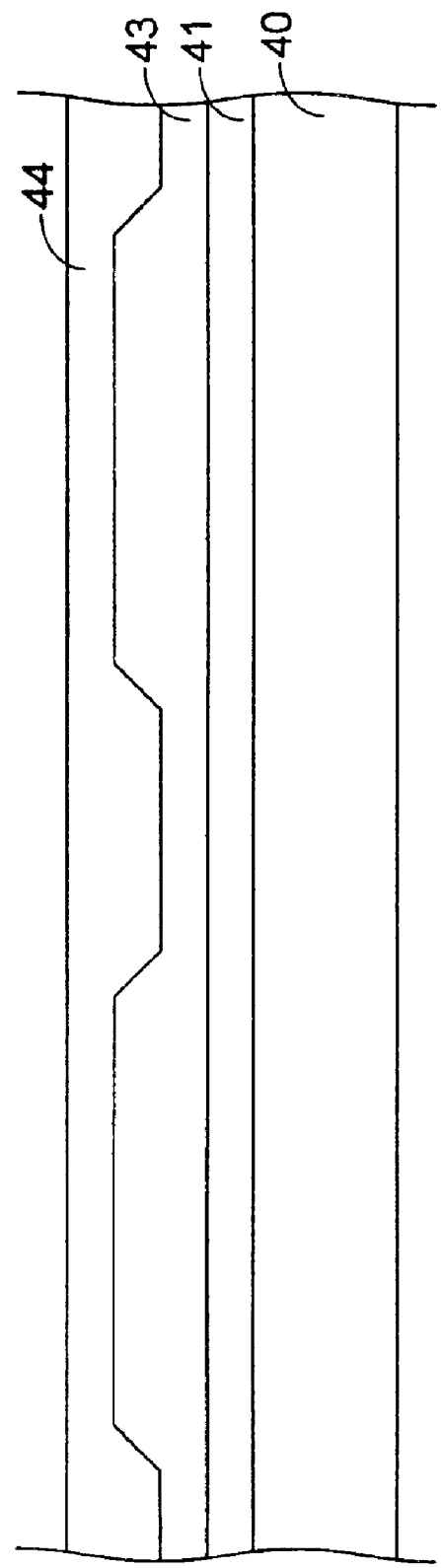

Alternatively, the capacitance of the storage capacitor can be improved by increasing the effective surface area of the top electrode. At first, a bottom electrode layer 41 (polysilicon layer) and a raw insulator layer 42 (silicon dioxide layer) are formed sequentially on a transparent substrate 40 (FIG. 3(a)) by plasma enhanced chemical vapor deposition processes. Then, the raw insulator layer 42 is etched by a photolithography process to form an insulator 43 having a bump surface (FIG. 3(b)). The bump surface consists of relatively raised portions and relatively recessed portions. The next step is forming a top electrode layer 44 (metal layer) covering the insulator 43 (FIG. 3(c)) by a sputtering process. Thus, the top electrode 44 formed on the bump surface of the insulator 43 correspondingly has a bump surface and thus increased effective surface area. Furthermore, the transparent area outside the storage capacitor is not reduced. Therefore, no additional power is needed for keeping the brightness of the present liquid crystal display.

Figure 4B:
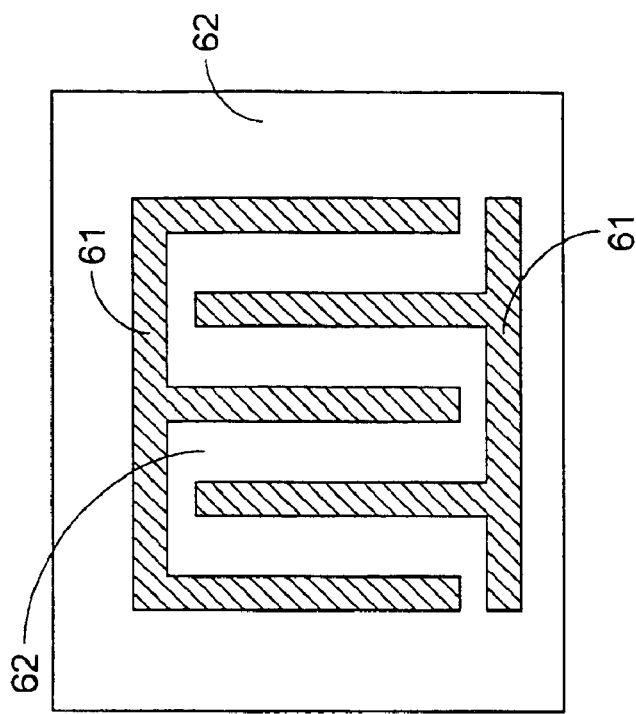
FIGS. 4(a)~(d) are top views showing embodiments of the bottom electrode or insulator in FIGS. 2 and 3.
Figure 4A:
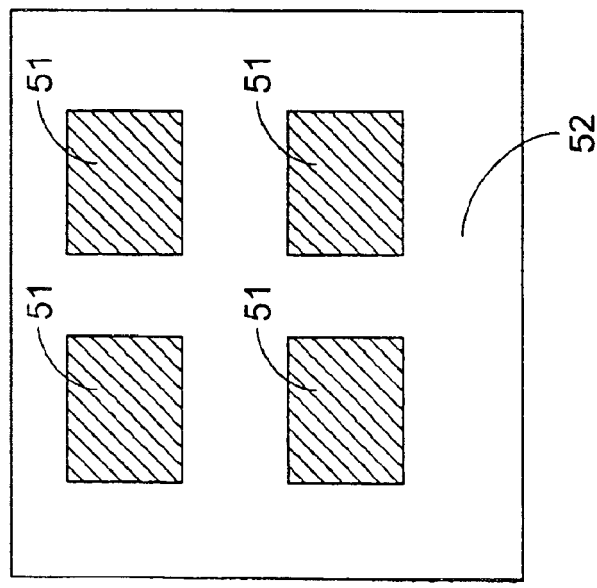
Figure 4D:
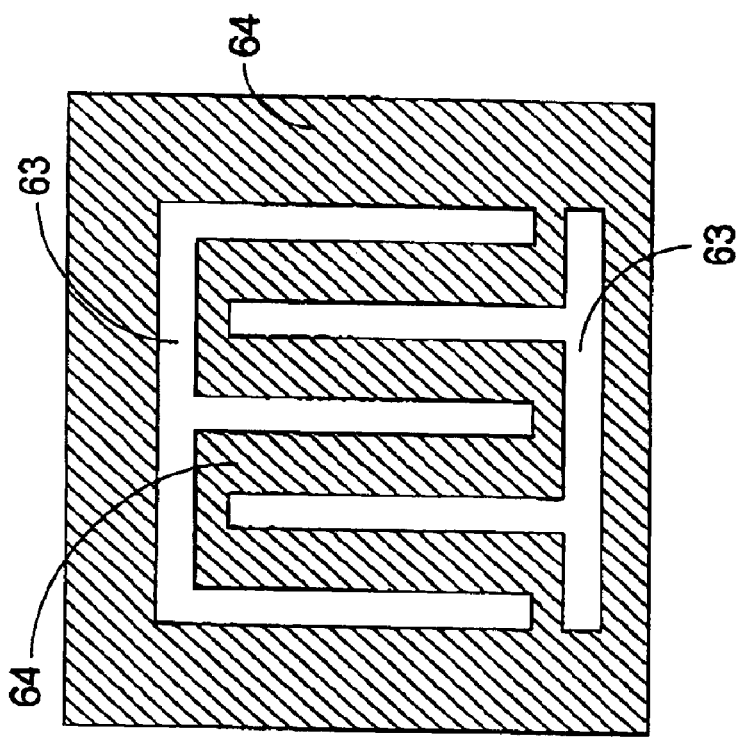
Figure 4C:
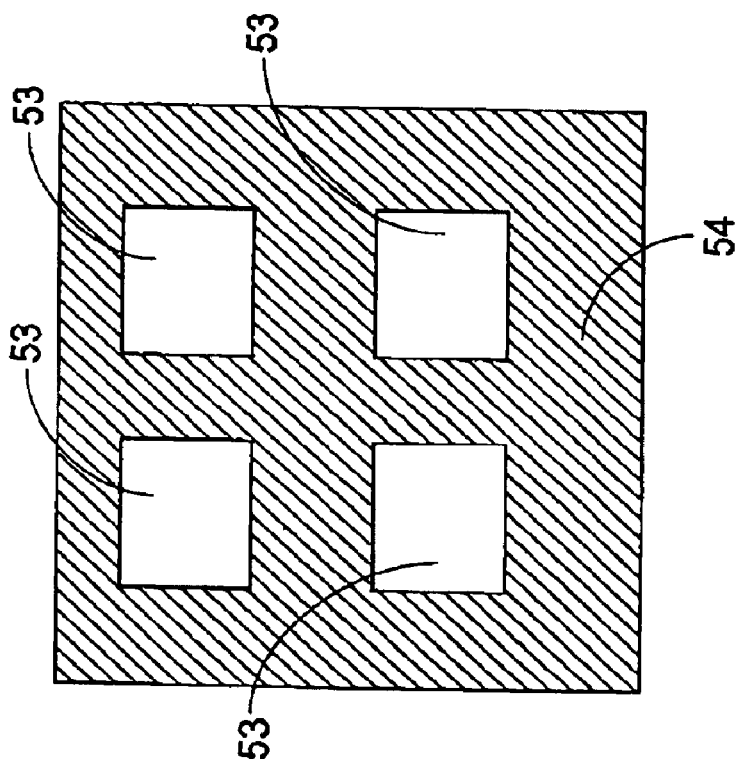

Please refer to FIGS. 4(a) and (b). These top views clearly show the raised portions, as indicated by hatched regions 51 and 61, and recessed portions, as indicated by the unhatched regions 52 and 62, of the bottom electrode or insulator. FIGS. 4(a) and 4(b) differs from each other in distribution and shapes of the raised portions and recessed portions. In FIG. 4(a), the raised portion includes a plurality of rectangular zones 51 in top plane view of the bottom electrode or insulator. On the other hand, the raised portion includes a plurality of strips 61 arranged as a comb-like shape. The distribution and shapes of the bumped and recessed structures may vary with specific requirements. Certainly, the relatively raised portions and relatively recessed portions can be exchanged by etching the hatched regions instead of the unhatched regions. As shown in FIGS. 4(c) and 4(d). the recessed portions include a plurality of rectangular zones 53 and stripes 63 enclosed by the hatched regions 54 and 64. Alternatively, both the top electrode and the bottom electrode can have bump surfaces. It is to be noted that the terms "relatively raised portion" and "relatively recessed portion" mean the raised and the recessed portions are relative expressions rather than absolute expressions. In other words, for example, the presence of the raised structures is due to the creation of the recessed portions. In fact, the top or bottom electrode layer is not "raised" but just "recessed" in the embodiments. Of course, it is also possible to create the raised/recessed structures by raising instead of recessing the electrode layer, or making raised and recessed portions independently, if necessary.

Figure 5B:
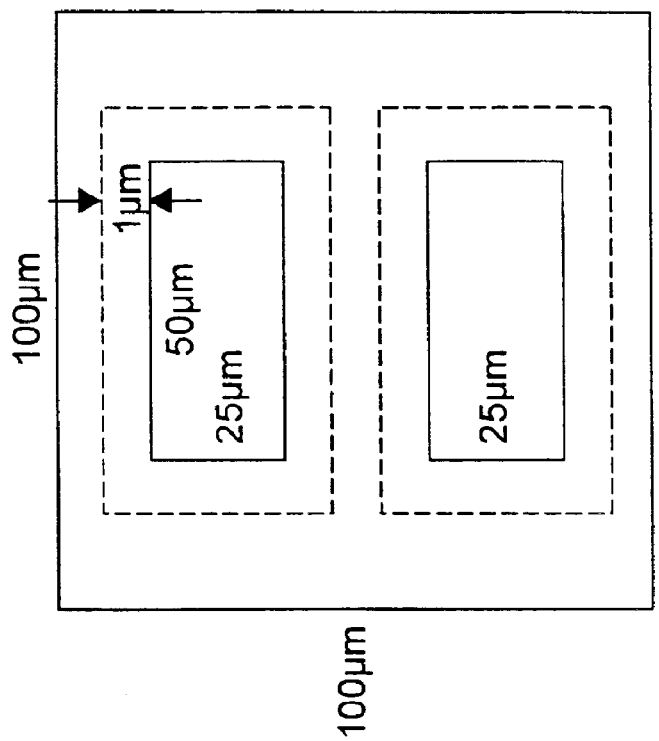
FIGS. 5(a)~(c) are schematic diagrams for explaining the increased surface area according to the present invention.
Figure 5A:
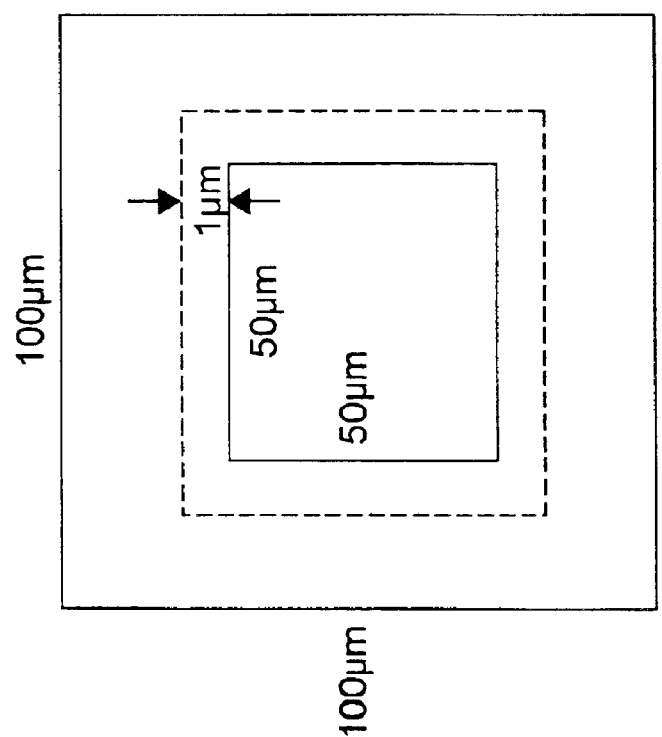
Figure 5C:
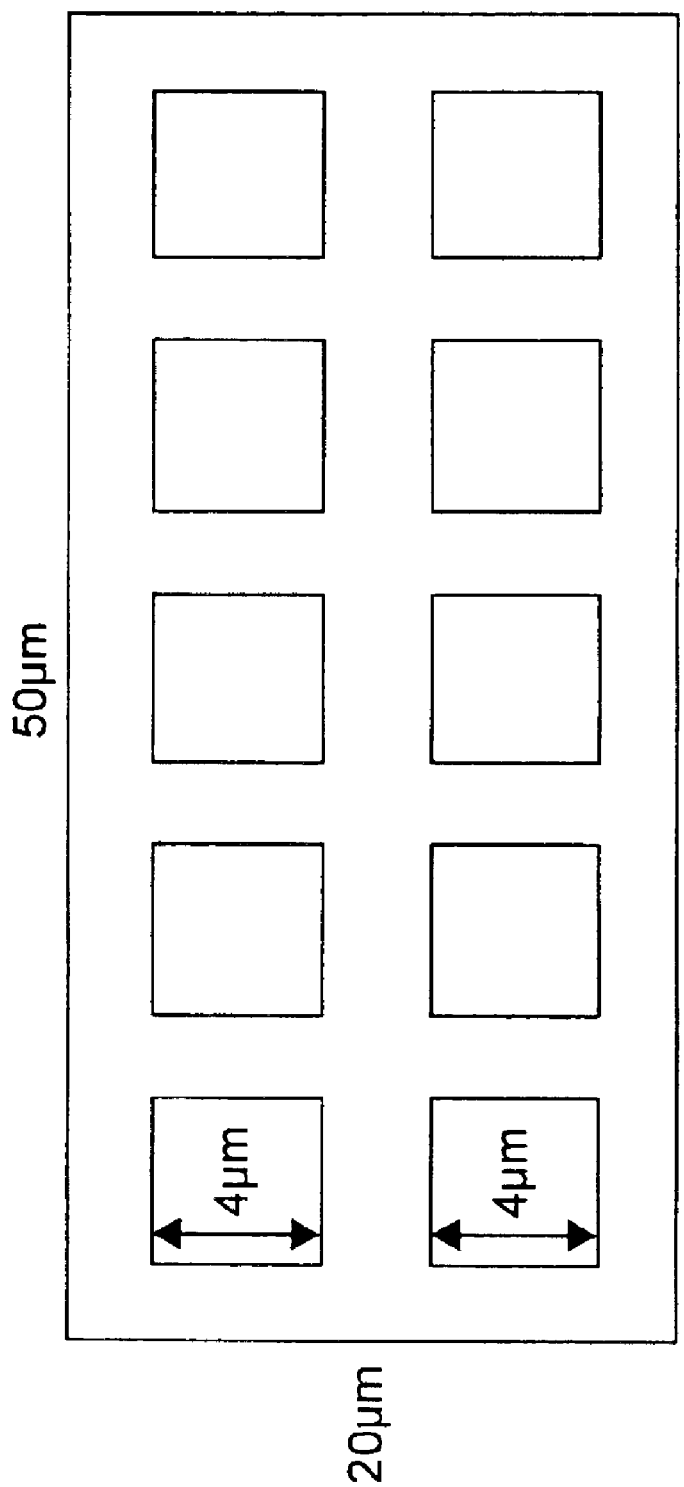

Please refer to FIGS. 5(a)~(c) which are schematic diagrams exemplifying the increase of the effective surface area of the storage capacitor according to the present invention. For the sake of calculation, it is assumed that each of the lateral surfaces of the raised portions is inclined with an angle 45° relative to the substrate 30. The capacitance of the storage capacitor structure of FIG. 5(a) increases approximately 0.85% compared to the conventional flat one. The calculation is based on the following equations:

capacitance=capacitance per unit area×area original area=100 μm×100 μm=10000 μm² improved area=plate area+edge area=((100 μm)²−(52 μm)²+(50 μm)²)+((52 μm)²−(50 μm)²×1.414=10084.5 μm²

Hence, the capacitance increases by approximately 0.85%.

In the same manner, the improved area of the structure of FIG. 5(b)=((100 μm)²−(52 μm×27 μm)×2+(50 μm×25 μm)×2))+(52 μm×27 μm−50 μm×25 μm)×2×1.414=10127.5 μm². That is, the capacitance increases by approximately 1.27%.

As for the storage capacitor structure in FIG. 5(c), the original area=50 μm×20 μm=1000 μm², and the improved area=(50 μm×20 μm−(6 μm)×10+(4 μm×4 μm)×10))+(6 μm×6 μm−4 μm×4 μm)×10×1.414=1082.8 μm². That is, the capacitance increases by approximately 8.28%.

From the description of the above-mentioned preferred embodiments, it is known that the capacitance of the disclosed storage capacitor raises without increasing the size of the structure (or electrodes). The more raised/recessed portions are, the higher capacitance of the storage capacitor structure is. Hence, no additional power is needed to compensate the reduced size of the transparent area. Besides etching method, other means to produce uneven surface of the electrode or insulator is certainly included in the scope of the present invention. The present invention is not limited to the described materials. For example, insulator may be made of silicon nitride instead of silicon dioxide.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A storage capacitor structure of a planar display, comprising:

a bottom electrode;

an insulator formed on said bottom electrode; and a top electrode formed on said insulator, wherein at least one of said bottom electrode and said top electrode has a bump structure including at least one rectangular recessed portion on a surface thereof in contact with said insulator.

2. The storage capacitor structure according to claim 1 wherein said bottom electrode is made of polysilicon and said top electrode is made of metal.

3. The storage capacitor structure according to claim 1 wherein said insulator is made of silicon dioxide.

4. The storage capacitor structure according to claim 1 being formed on a light-transmissible substrate.

5. A method for fabricating a storage capacitor structure comprising steps of:

providing a light-transmissible substrate;

forming a bottom electrode layer having a bump structure including at least one rectangular recessed portion on said substrate;

forming an insulator layer on said bottom electrode layer; and forming a top electrode layer on said insulator layer.

6. The method according to claim 5 wherein said bottom electrode layer is made of polysilicon and said top electrode layer is made of metal.

7. The method according to claim 5 wherein said insulator layer is made of silicon dioxide.

8. The method according to claim 5 wherein said bump structure is created by performing a masking and etching process of said bottom electrode layer.

9. A method for fabricating a storage capacitor structure comprising steps of:

providing a light-transmissible substrate;

forming a bottom electrode layer on said substrate;

forming an insulator layer having a first bump structure including at least one rectangular recessed portion on said bottom electrode layer; and forming a top electrode layer on said insulator layer, thereby providing said top electrode layer with a second bump structure conforming to said first bump structure.

10. The method according to claim 9 wherein said bottom electrode layer is made of polysilicon and said top electrode layer is made of metal.

11. The method according to claim 9 wherein said insulator layer is made of silicon dioxide.

12. The method according to claim 9 wherein said first bump structure is created by performing a masking and etching process of said insulator layer.

13. A storage capacitor structure of a planar display, comprising:

a bottom electrode;

an insulator formed on said bottom electrode; and a top electrode formed on said insulator, wherein at least one of said bottom electrode and said top electrode has a bump structure including at least two strip-shaped raised portions interconnected to each other on a surface thereof in contact with said insulator.

14. The storage capacitor structure according to claim 13 wherein said bump structure includes a plurality of strip-shaped raised portions arranged as a comb-like shape.

15. A storage capacitor structure of a planar display, comprising:

a bottom electrode;

an insulator formed on said bottom electrode; and a top electrode formed on said insulator, wherein at least one of said bottom electrode and said top electrode has a bump structure including at least two strip-shaped recessed portions interconnected to each other on a surface thereof in contact with said insulator.

16. The storage capacitor structure according to claim 15 wherein said bump structure includes a plurality of strip-shaped recessed portions arranged as a comb-like shape.

* * * * *